US012566202B2

(12) United States Patent
Schroff et al.

(10) Patent No.: US 12,566,202 B2
(45) Date of Patent: Mar. 3, 2026

(54) TEST DEVICE FOR HIGH-FREQUENCY APPLICATIONS

(71) Applicant: INGUN PRÜFMITTELBAU GMBH, Constance (DE)

(72) Inventors: Wilhelm Schroff, Constance (DE); Sergiy Royak, Constance (DE)

(73) Assignee: INGUN PRÜFMITTELBAU GMBH, Constance (DE)

( * ) Notice: Subject to any disclaimer, the term of this patent is extended or adjusted under 35 U.S.C. 154(b) by 96 days.

(21) Appl. No.: 18/577,425

(22) PCT Filed: Jun. 23, 2022

(86) PCT No.: PCT/EP2022/067178
§ 371 (c)(1),
(2) Date: Jan. 8, 2024

(87) PCT Pub. No.: WO2023/280582
PCT Pub. Date: Jan. 12, 2023

(65) Prior Publication Data

US 2024/0345148 A1      Oct. 17, 2024

(30) Foreign Application Priority Data

Jul. 8, 2021    (DE) ..................... 10 2021 117 664.6

(51) Int. Cl.
*G01R 29/08*        (2006.01)
*G01R 29/10*        (2006.01)
(52) U.S. Cl.
CPC ......... *G01R 29/0878* (2013.01); *G01R 29/10* (2013.01)

(58) Field of Classification Search
CPC ............................ G01R 29/0878; G01R 29/10
See application file for complete search history.

(56) References Cited

U.S. PATENT DOCUMENTS 5,781,018 A        7/1998   Davidov et al.
7,868,634 B2 *    1/2011   Boss ................... G01R 1/06788
                                                              324/755.05
(Continued)

FOREIGN PATENT DOCUMENTS

DE             69609336 T2        3/2001
DE         102011088171 A1        6/2013
(Continued)

OTHER PUBLICATIONS

International Search Report and Written Opinion dated Oct. 11, 2022 for corresponding application PCT/EP2022/067178.
(Continued)

*Primary Examiner* — Thien M Le
(74) *Attorney, Agent, or Firm* — Bachman & LaPointe, P.C.

(57)                 ABSTRACT

A test probe (10) for contactlessly measuring the electromagnetic properties of a radio unit (20), in particular an antenna unit, having a hollow conductor (1) for transmitting electromagnetic waves, a filling element (2) which is disposed in the hollow conductor and made of a dielectric material, a lens element (3) which is disposed on the end face of the hollow conductor (1) and made of a dielectric material for coupling electromagnetic waves into the hollow conductor (1), and a contact portion (4) which is disposed on the hollow conductor end opposite the lens element (3) and which serves to decouple a measurement signal.

20 Claims, 4 Drawing Sheets

(56)     References Cited

U.S. PATENT DOCUMENTS

| | | | |
|---|---|---|---|
| 9,234,928 B2 * | 1/2016 | Nakase | G01R 29/0878 |
| 10,002,818 B2 * | 6/2018 | Rollin | H01P 3/06 |
| 2003/0123793 A1 * | 7/2003 | Johannessen | G02B 6/34 |
| | | | 385/36 |
| 2004/0013359 A1 * | 1/2004 | Lee | G02B 6/4214 |
| | | | 385/14 |
| 2004/0013378 A1 * | 1/2004 | Lee | G01M 11/35 |
| | | | 385/125 |
| 2012/0268153 A1 * | 10/2012 | Nickel | G01R 31/3025 |
| | | | 324/754.31 |
| 2013/0307522 A1 | 11/2013 | Nakase | |
| 2014/0091972 A1 | 4/2014 | Hoang et al. | |
| 2014/0363905 A1 * | 12/2014 | McShane | G01R 31/2889 |
| | | | 324/756.01 |
| 2017/0102409 A1 * | 4/2017 | Sarhad | G01R 31/31905 |
| 2020/0217879 A1 * | 7/2020 | Kalatzis | G01R 29/0878 |

FOREIGN PATENT DOCUMENTS

| | | | |
|---|---|---|---|
| DE | 102016207998 B3 | 9/2017 | |
| DE | 102019215280 A1 | 4/2021 | |
| JP | 2001255347 A | 9/2001 | |
| WO | 2020103031 A1 | 5/2020 | |

OTHER PUBLICATIONS

German Search Report dated Mar. 9, 2022 for corresponding application DE102021117664.6.

* cited by examiner

55

10

50

55

56

52

51

54     52    53a    54     52          52

53b
53c 53b
53c

54

53a    54

56

50

57a                                              58    56

58                              57a    57b

TEST DEVICE FOR HIGH-FREQUENCY APPLICATIONS

BACKGROUND OF THE INVENTION

The present invention relates to a test probe for high-frequency applications, in particular for contactlessly measuring the electrical or electromagnetic properties of a radio unit, in particular an antenna unit or an array antenna, and to an associated method for contactless measurement, in particular near-field measurement.

Due to the advancing technological development of high-frequency applications, the antennas or array antennas installed in base stations and the end devices communicating with them, which operate using the 5G mobile phone standard, for example, are becoming more complex. This results in new application possibilities, such as the so-called Massive MIMO (Multiple Input, Multiple Output) method, in which a plurality of antenna elements of an array antenna are interconnected for simultaneous signal transmission to several end devices with increased data capacity and (3D) beamforming is also used to enable optimized bundling and alignment of the transmission power to a respective end device. At the same time, however, corresponding devices and systems are required for testing purposes of such applications, which enable economical and at the same time reliable testing of, for example, an amplitude property or a phase property of corresponding wireless antenna elements or array antennas.

Generally, antenna elements or array antennas for such high-frequency applications do not have any test connections, so that testing or measuring the antenna properties must be carried out using the over-the-air (OTA) method and thus without contact.

From the state of the art, solutions are already known which detect the antenna properties, for example by means of near-field measurement. For example, DE 10 2019 215 280 A1 discloses a test probe for testing electronic test objects such as a dipole antenna, having a sensor disposed on the carrier with two pin-shaped antennas, which are electrically connected and are configured to detect in particular an electrical or electromagnetic property of the test object. The pin-shaped antennas are formed as wire elements or coaxial wires.

WO 2020/103031 A1 discloses a directional probe for broadband measurement of antenna characteristics, having a coaxial conductor with an inner conductor, an insulator surrounding it, and an outer conductor. A connecting conductor provided on the end face extends uniaxially and parallel to a front surface of the coaxial conductor and connects the inner and outer conductors.

Test solutions which are designed for testing in the far field of the antenna and for direct measurement of the respective field properties are also known. However, these have the disadvantage of a significantly more complex test procedure, in which, for example, in a measuring chamber, a test device must be placed successively at a plurality of different positions in the far field of the antenna to be tested, whereby a corresponding measurement must be carried out at each of the positions with corresponding control of the antenna.

DE 10 2011 088 171 A1 discloses a method for testing microwave signals from electronic components, whereby a far field from a radiation source is detected in the component to be tested. The microwave signals are received by an antenna device consisting of several individual antennas with a specific aperture width. The distance between the antenna device and the electronic component is selected to be greater than 1.5 times the wavelength of the measured microwave signals and less than 2 times the aperture width. The electric field distribution in the plane of the electronic component is determined by calculating the signal propagation back to the signal source.

SUMMARY OF THE INVENTION

In the light of this state of the art, the object of the present invention is to provide an improved test device which enables economical and reliable testing of an antenna element or an array antenna in the context of high-frequency applications. In particular, a device and an associated method for contactless testing or measurement are to be provided, with which an antenna element or an array antenna can be tested regarding its properties and in particular regarding an amplitude property and/or phase property.

This object is attained by the test probe, the test device and the method according to the independent claims and as disclosed herein. The dependent claims describe advantageous further embodiments of the present invention.

In a first aspect, the present invention relates to a test probe for contactlessly measuring the electromagnetic properties of a radio unit, in particular an antenna unit, having a hollow conductor for transmitting electromagnetic waves, a filling element which is disposed in the hollow conductor and made of dielectric material, a lens element which is disposed on the end face of the hollow conductor and made of dielectric material for coupling electromagnetic waves into the hollow conductor, and a contact portion which is disposed on the hollow conductor end opposite the lens element for decoupling a measurement signal.

The present invention makes it possible to provide a test probe with a simplified structure for reliably testing a respective antenna unit of an array antenna by means of near-field measurement. This can be integrated much better into a production process than the far-field measuring devices known from prior art. Due to the design with a hollow conductor for transmitting the electromagnetic waves, a relatively large frequency range can be detected with the test probe. Furthermore, the arrangement according to the invention of the filling element, which is made of dielectric material, in the hollow conductor reduces the propagation speed of the electromagnetic waves in the hollow conductor, resulting in a lower frequency of the signal to be transmitted with the same diameter of the hollow conductor. This enables a simplified and compact design with simultaneously optimized signal evaluation.

The test probe according to the invention is designed at least for measuring a respective amplitude property of a test object. In particular, the test probe can be used to measure at least one respective field strength for testing or evaluating an individual antenna element in a simple manner.

The test probe is preferably pin-shaped, with the hollow conductor preferably extending axially. In a preferred embodiment, the hollow conductor is a circular hollow conductor. It preferably has a circular and, alternatively, an oval or elliptical cross section. The hollow conductor is made of a material with good conductivity, such as copper, aluminum, silver or gold.

The test probe is preferably designed for measuring or testing antenna elements or array antennas which emit in the bandwidth range of the mobile phone standard 5G, and in particular in the range from 24.25 to 29.5 GHz. The invention is not limited to this frequency range and can also be used for other frequencies and in particular for higher frequencies.

The filling element is preferably made of plastic and has a relative permittivity $\varepsilon_r$ of 2.5 to 10, more preferably of 2.8 to 9.7 and further preferably of 6.5 to 9.7 In a particularly preferred embodiment, the filling element is made of polyether ether ketone (PEEK) with a relative permittivity $\varepsilon_r$ of 3.3. In another particularly preferred embodiment, the filling element consists of Preperm from the manufacturer Premix, for example Preperm PPE800 or Preperm PPE950, having a relative permittivity $\varepsilon_r$ of 8 or 9.5.

Alternatively, the filling element can consist of a ceramic material such as aluminum oxide, in particular a multilayer ceramic material such as high temperature co-fired multi-layer ceramic (HTCC) or low temperature co-fired multi-layer ceramic (LTCC). The multilayer ceramic material can have integrally formed conductor elements, which are incorporated into the material during manufacture. In this embodiment, the relative permittivity $\varepsilon_r$ is preferably between 7 and 10, preferably between 7 and 9.5.

The filling element preferably extends over the total length of the hollow conductor and can be formed by one or multiple piece(s). The filling element is preferably a substantially cylindrical element and can have recesses, in particular in a lateral surface of the filling element. Furthermore, the filling element can have conductors disposed therein or formed integrally therein.

The lens element of the test probe is preferably an electric lens on a tip of the test probe. The lens element preferably extends out of the hollow conductor in the longitudinal direction of the test probe. The lens element thus protrudes beyond an end face end region of the hollow conductor on the end face. The lens element is preferably made of plastic and has a relative permittivity $\varepsilon_r > 1$. In a preferred embodiment, the lens element is made of plastic and has a relative permittivity $\varepsilon_r$ of 2.5 to 10, more preferably of 2.8 to 9.7 and further preferably of 6.5 to 9.7.

In a preferred embodiment, the lens element consists of polyether ether ketone (PEEK) with a relative permittivity $\varepsilon_r$ of 3.3. In a further preferred embodiment, the lens element consists of Preperm from the manufacturer Premix, for example Preperm PPE800 or Preperm PPE950, having a relative permittivity $\varepsilon_r$ of 8 or 9.5. Alternatively, the lens element can be formed from ceramic material, analog to the filling element described above. The lens element is also preferably formed integrally with the filling element, i.e., in one piece, or at least with a part of the filling element.

The lens element is preferably an ellipsoid on the tip of the test probe. Alternatively, the lens element can form a tiered tip of the test probe. In this case, the lens element preferably has a planar, preferably circular, front surface and at least two, preferably at least three, coaxially disposed tiers which increase in diameter.

The test probe can have a collar, preferably made of conductive material, for shielding against laterally inciding electromagnetic waves, said collar being disposed on the end portion of the hollow conductor assigned to the lens element. The collar can have a cylindrical portion disposed parallel to the remaining lateral surface of the test probe. The collar can be disposed so as to only surround a proximal portion of the lens element or extend at least partially to a distal portion of the lens element. In particular, when testing or measuring several neighboring antenna elements of an array antenna, the collar can suppress or prevent electromagnetic waves inciding from neighboring antenna elements.

In a preferred embodiment, the lens element has an electrical conductor which extends at least partially in the longitudinal direction of the test probe or of the hollow conductor and which is disposed centrally. In particular, this can be a thin wire extending axially and centrally in the lens element. This optimizes the guidance of the electromagnetic waves in the hollow conductor and short-circuits in particular the electrical part of the $TM_{01}$ mode, whereas the propagation of the basic mode $TE_{11}$ is not affected.

In a preferred embodiment, the test probe has a polarizer disposed downstream of the lens element in the longitudinal direction or direction of wave propagation, said polarizer being configured to convert the electromagnetic waves of linear polarization inciding in the test probe into a circular electromagnetic wave. The polarizer has a plurality of parallel, groove-shaped recesses, which are disposed in a lateral surface of the filling element and which extend essentially perpendicular to the longitudinal direction of the test probe. The recesses are preferably disposed in two opposing lateral sections of the filling element and are further advantageously essentially uniform in shape. In particular, the respective recesses have a constant cross section and depth in the filling element.

The test probe preferably has an absorber made of ferromagnetic material, such as iron, disposed downstream of the polarizer in the longitudinal direction or direction of wave propagation. This is preferably flat, for example in the form of a flat tongue, and preferably extends centrally and parallel to the longitudinal direction or direction of wave propagation of the test probe. The absorber preferably extends in a plane, which is disposed at an offset of 45° with respect to an extension of the groove-shaped recesses of the polarizer or a respective groove bottom of the recesses in a longitudinal sectional view. The absorber absorbs a linearly polarized wave from the circular wave generated by the polarizer, which itself consists of two linearly polarized waves with a phase shift of 90°.

Furthermore, the test probe preferably has a taper portion which is disposed downstream of the absorber in the longitudinal direction and in which the cross section of the filling element is tapered along a plane in the longitudinal direction or direction of wave propagation, said plane being positioned orthogonally to the plane in which the absorber extends. In particular, the taper portion is designed in such a way that a cross section of the filling element in the longitudinal direction or direction of wave propagation changes from a round cross section to a semicircular cross section. In this case, the taper portion has a conductor element which is formed complementarily to the filling element and which broadens, in particular in a semi-conical manner, in the longitudinal direction or direction of wave propagation towards the contact portion of the test probe. The tapering of the cross section enables optimized wave guidance in a portion of the hollow conductor upstream of the contact portion. In particular, this prevents unwanted excitation of the $TM_{01}$ mode.

More preferably, the contact portion of the test probe has a coaxial connector disposed on the end face, whereby an inductive coupling to the inner conductor of the coaxial connector takes place for the decoupling of a measuring signal. In this case, the contact portion preferably comprises an SMPM connector.

In another preferred embodiment, the test probe has a taper portion which is disposed between the lens element and the rear contact portion of the test probe, which preferably has a constant cross-sectional shape and which is preferably constantly tapered. Said taper portion has a diameter which is preferably constantly tapered in the longitudinal direction or direction of wave propagation. In particular, in this constantly tapered taper portion, the diameter of the hollow conductor and the filling element disposed therein is tapered in the longitudinal direction.

The contact portion of the test probe of this embodiment preferably has two contact elements which are disposed at an offset to each other in the longitudinal direction or direction of wave propagation and which are formed for tapping a respective linear polarization. In particular, the contact elements for decoupling a measurement signal are formed for a first, in particular horizontal, polarization, and a second, in particular vertical, polarization.

The electrical contact elements each comprise a coaxial connector, which is preferably disposed on the lateral surface. Furthermore, the contact elements preferably each comprise an associated electrical conductor, which is disposed in the hollow conductor perpendicular to the extension or direction of wave propagation. The electrical contact elements thus advantageously form a kind of dipole probe for coupling out the respective measuring signals. A first conductor of the first contact element is preferably pin- or wire-shaped and disposed at an offset of 90° to a second conductor of the second contact element, which is preferably also pin- or wire-shaped. Furthermore, additional conductor elements, for example pin or wire-shaped conductors, can advantageously be provided as short circuits in a rear area of the hollow conductor, which in particular enable optimized electrical isolation or insulation between the two contact elements in the hollow conductor.

As an alternative to the aforementioned design, the contact portion can also be configured in such a way that inductive decoupling of a measuring signal is possible.

This embodiment of the test probe is preferably designed to measure a respective amplitude property and the phase properties of a test object. In particular, the test probe can be used to measure an amplitude property for both a first and a second polarization. This enables a more detailed measurement and testing of a respective test object broken down according to the respective phase property.

In another aspect, the invention relates to a device for testing an array antenna having a plurality of test probes, as described above, wherein the device has one or several retaining element(s) for each test probe, said retaining element(s) allowing a predefined arrangement of the test probes, preferably at a distance to each other of $\lambda/2$ of the frequency emitted by the array antenna.

An array antenna is to be understood here as an interconnection of individual antenna elements. The distance between the individual antenna elements is determined by the frequency range of the array antenna and usually corresponds to $\lambda/2$. The array antenna can comprise an arrangement of antenna elements in a rectangular array. However, the array antenna can also have different shapes, in particular curved shapes.

The device is preferably designed in such a way that a respective test probe is disposed in the direction of radiation of a respective antenna element, directly opposite said antenna element. In this case, the retaining elements for the test probes can be designed to be adjustable, in particular in order to adapt a respective distance of the test probes to each other and/or the respective spatial alignment of the individual test probes to the test object.

The test device according to the invention enables simultaneous measurement and testing of a plurality of antenna elements of an array antenna with the test probe according to the invention. In addition to a direct measurement of a respective antenna element of the array antenna regarding its function, for example, a mere check of correct functioning by amplitude measurement or measurement of the field strength, a simultaneous check of the functioning of the array antenna can also be carried out by a measurement at several measuring points by the individual test probes, on the basis of which, for example, a subsequent near-field to far-field calculation can be carried out.

In a preferred embodiment, the device comprises an evaluation unit for this purpose, which is connected to the individual test probes of the device and configured to perform a near-field to far-field mapping algorithm. This allows a calculation or transformation of the near-field measurement results to a far-field, based on the measurement results of the individual test probes recorded in the near-field. The underlying method for such a calculation or algorithm is known from the prior art, see for example Antenna Theory, Analysis and Design, Constantine A Balanis; or https://de.mathworks.com/matlabcentral/fileexchange/23385-nf2ff.

In another aspect, the invention relates to a method for contactless measurement, in particular near-field measurement, of the electrical or electromagnetic properties of a radio unit, in particular an antenna unit or an array antenna, wherein the radio unit emits microwave signals, in particular in the frequency band of the 5G mobile phone standard, and wherein the emitted microwave signals are detected, as described above, by an assigned test probe or an assigned test device and evaluated by an assigned evaluation unit.

The method can include the further step of a near-field to far-field calculation or the execution of a near-field to far-field mapping algorithm, as described above in connection with the device according to the invention.

BRIEF DESCRIPTION OF THE DRAWINGS

Details, further advantageous effects and details of the present invention are explained below with reference to the schematic, merely exemplary drawings.

Figures 1, 2, 3, 4:
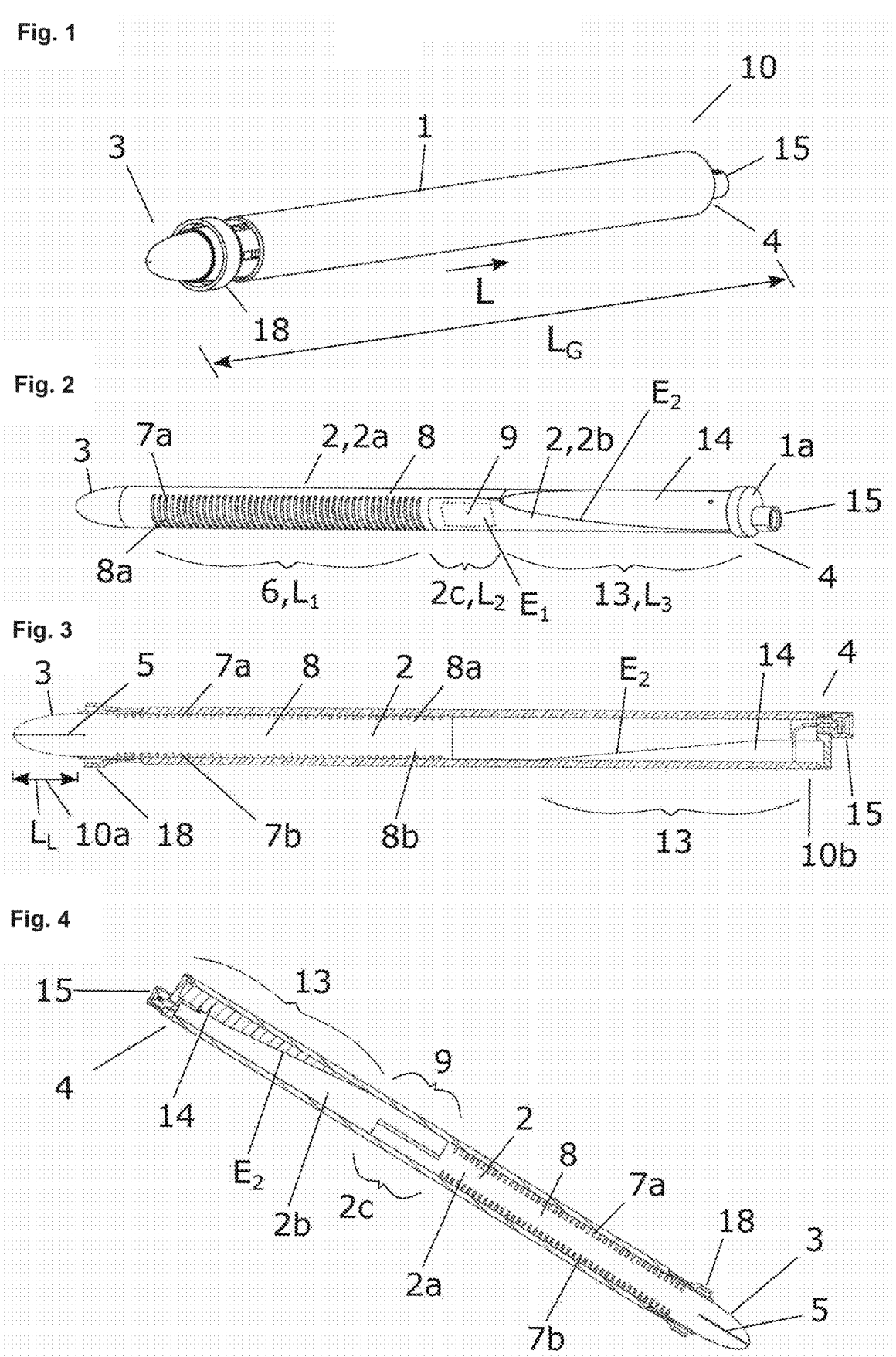
FIG. 1: shows a perspective view of a preferred first embodiment of the test probe according to the invention.
FIG. 2: shows a side view of the test probe according to FIG. 1 without the hollow conductor surrounding filling element.
FIG. 3, 4: show lateral sectional views of the test probe according to FIG. 1.

A first preferred embodiment of the test sample according to the invention is described below with reference to FIGS. 1-5.

DETAILED DESCRIPTION

Test probe 10 according to the invention comprises a lens element 3 which is disposed on a tip of test probe 10a and which serves to couple electromagnetic waves, a hollow conductor 2 for transmitting electromagnetic waves and a contact portion 4 which is disposed on the rear and in particular on an end 10b of test probe 10 opposite lens element 3 or tip 10a and which serves to decouple a measurement signal. Test probe 10 is essentially pin-shaped and thus extends axially from tip 10a to opposite end 10b, on which contact portion 4 is formed. A total length $L_G$ of the test probe is preferably between 30 to 150 mm, more preferably between 30 to 120 mm.

Hollow conductor 1 is designed as a circular hollow conductor with a circular cross-sectional shape and has a hollow cylindrical shape which is constant in the longitudinal direction L. A filling element 2 made of dielectric material, for example a plastic such as PEEK or Preperm PPE, is disposed in hollow conductor 1. Filling element 2 preferably extends over the entire length of hollow conductor 1 or fills it over the entire length. The cross-sectional shape of filling element 2 can vary to some extent. Furthermore, filling element 2 can be formed in one piece or in several pieces. In the present case, filling element 2 comprises at least a first filling element portion 2a facing tip 10a and a rear, second filling element portion 2b. These are disposed so as to rest against each other on a stepped contact portion 2c which is formed complementarily. In the embodiment shown, lens element 3 is formed as an ellipsoid integrally with filling element 2 and in particular integrally with first filling element portion 2a. Ellipsoid lens element 3 is also disposed in such a way that it protrudes from hollow conductor 1 in longitudinal direction L. Lens element 3 preferably has a lens length $L_L$ of 5 to 20 mm, more preferably of 6 to 12 mm in longitudinal direction L.

At tip 10a, hollow conductor 1 advantageously has a collar 18 associated with lens element 3. Said collar 18 serves for shielding against electromagnetic waves inciding from the side, in particular when measuring or testing an array antenna.

Furthermore, test probe 10 has an electrical conductor 5 which extends at least in sections in longitudinal direction L on lens element 3 and which is centrally disposed. Said electrical conductor 5 can be formed in particular by a thin wire extending centrally from a tip of lens element 3 in longitudinal direction L of the probe.

In the longitudinal direction or direction of wave propagation, test probe 10 comprises a polarizer 6 downstream of lens element 3, an absorber 9 disposed downstream thereof and a taper portion 13 disposed downstream thereof.

Polarizer 6 is designed in such a way that it converts electromagnetic waves inciding in the test probe into a circular electromagnetic wave, regardless of their linear polarization. For this purpose, polarizer 6 has a plurality of parallel, groove-shaped recesses 7a,7b, which are disposed in a lateral surface 8 of filling element 2. The groove-shaped recesses preferably extend perpendicular to longitudinal direction L of the test probe. Groove-shaped recesses 7a,7b are disposed in two opposite side portions 8a,8b of lateral surface 8 of filling element 2 (cf. FIG. 3, 4) and are essentially designed uniformly. Polarizer 6 preferably has a length L1 of 8 to 60 mm, more preferably of 10 to 50 mm, in longitudinal direction L.

Absorber 9, which is disposed downstream of polarizer 6, extends in a plane E1 in the longitudinal direction of test probe 10. Plane E1 is preferably parallel to opposing surfaces in a stepped contact portion 2c of filling element 2. Absorber 9 can in particular be designed as a rectangular flat tongue made of ferromagnetic material, which is advantageously attached to at least one of two filling element portions 2a,2b. Absorber 9 is preferably designed such that plane E1 is preferably offset by an angle $\alpha=45°$ relative to an extension or a groove bottom 19 of groove-shaped recesses 7a,7b of polarizer 6 in a longitudinal sectional view (cf. FIG. 5a). Absorber 9 preferably has a length L2 of 4 to 18 mm, more preferably of 5 to 14 mm, in longitudinal direction L.

Taper portion 13, which is disposed downstream of the absorber, has a tapered cross section of filling element 2 in longitudinal direction L. The cross section tapers along a plane E2 from a round cross-sectional shape to a semicircular cross-sectional shape. Plane E2 is preferably perpendicular to plane E1, in which absorber 9 is disposed (cf. FIG. 2). Taper portion 13 also comprises a conductor element 14 which is complementary to filling element 2 and which widens in the longitudinal direction towards contact portion 3 of the test probe, in particular in a semi-conical manner. Taper portion 13 preferably has a length L3 of 4 to 50 mm, more preferably of 5 to 45 mm, in longitudinal direction L.

Figures 5A, 5B, 6, 7A, 7B:
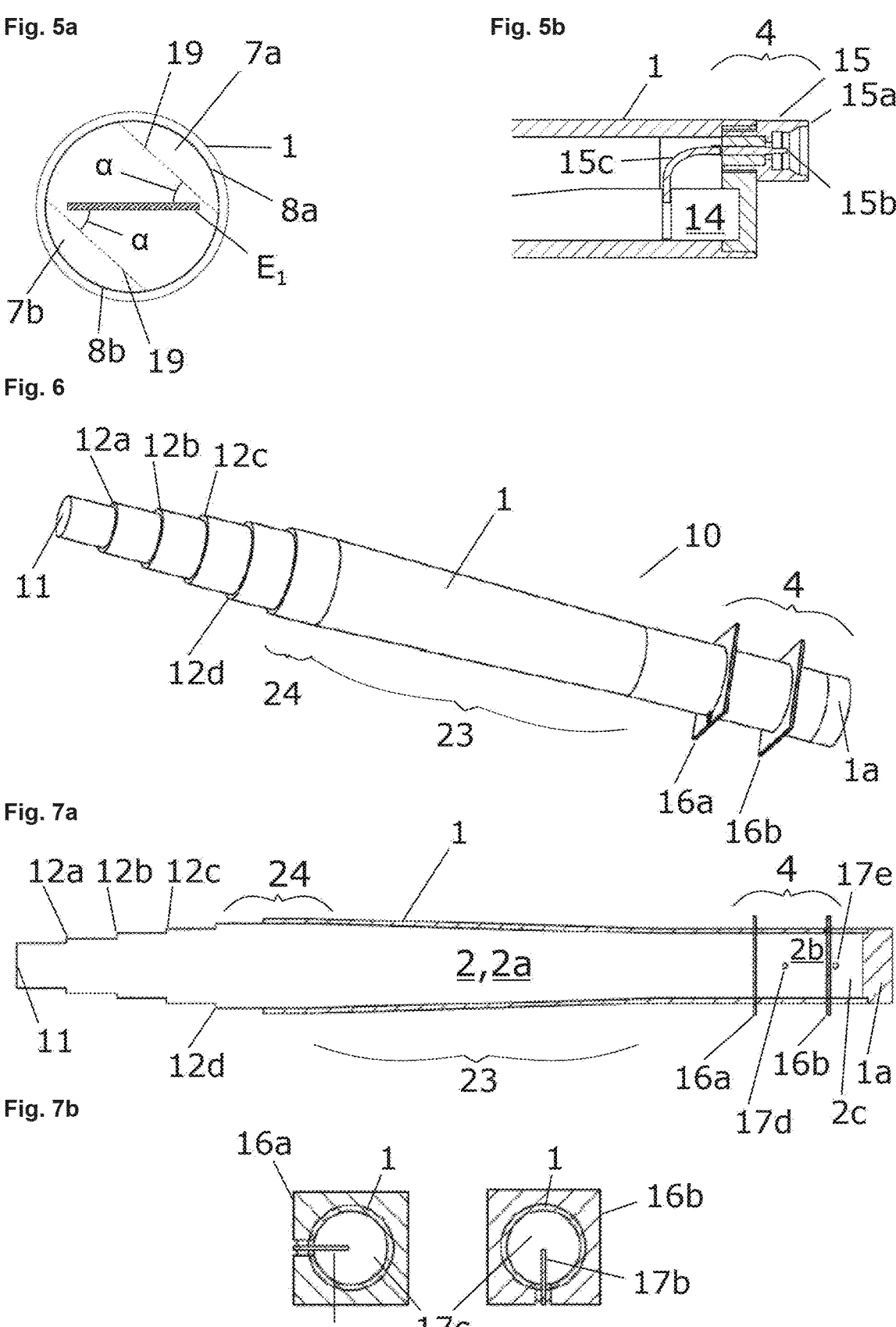
FIG. 5*a*: shows a cross sectional view through the absorber according to FIG. 1.
FIG. 5*b*: shows a detailed view of the contact portion of the test probe according to FIG. 1.
FIG. 6: shows a perspective view of a preferred second embodiment of the test probe according to the invention.
FIG. 7*a*: shows a lateral sectional view of the test probe according to FIG. 6.
FIG. 7*b*: shows sectional views of the electrical contacts of the test probe according to FIG. 6.

Conducting element 14 is connected to contact portion 4 of test probe 10 for decoupling a measurement signal. Contact portion 4 comprises a coaxial connector 15, in particular an SMPM connector. As shown in FIG. 5b, outer conductor 15a of coaxial connector 15 is conductively connected to hollow conductor 1. Inner conductor 15b is conductively connected to conductor element 14 by means of a bent wire 15c.

Test probe 10 can be adapted for specific high-frequency applications depending on the area of use. The dimensions of the hollow conductor, in particular a diameter of the hollow conductor, are selected in such a way that it can serve as a waveguide for transmitting electromagnetic waves for the respective application, in particular for the respective high-frequency application to be tested. A cut-off frequency ($TE_{11}$) for a circular hollow conductor is determined by the formula $f_0=(1.841\times c_0)/(\pi\times D\times\sqrt{\varepsilon_r})$, wherein $c_0$=speed of light in a vacuum, D=diameter and $\varepsilon_r$=relative permittivity in the hollow conductor.

Table 1 below shows exemplary dimensions of test probe 10 for high-frequency applications in the respective frequency range.

TABLE 1

| Application | 28 GHZ | 40 GHz | 70 GHz |
|---|---|---|---|
| filling element | Peek | Preperm PPE950 | Peek |
| relative permittivity | 3.3 | 9.5 | 3.3 |
| diameter hollow conductor | 6 mm | 2.2 mm | 2.2 mm |
| total length $L_G$ | 114 mm | 45 mm | 38 mm |

9

TABLE 1-continued

| Application | 28 GHZ | 40 GHz | 70 GHz |
|---|---|---|---|
| lens length $L_L$ | 9 mm | 7 mm | 7 mm |
| polarizer length $L_1$ | 45 mm | 11 mm | 11 mm |
| absorber length $L_2$ | 12 mm | 8 mm | 6 mm |
| taper length $L_3$ | 38 mm | 10 mm | 6 mm |

Test probe 10 according to the invention is used for near-field measurement of a test object. For example, during the measurement of an antenna element 20 (cf. FIG. 8), test probe 10 is positioned in the near field of antenna element 20 and preferably axially opposite it in the main radiation direction. Antenna element 20 emits electromagnetic waves with linear (horizontal and/or vertical) polarization 21a,21b. These are coupled into test probe 10 by lens element 3 and transmitted by means of hollow conductor 1 in longitudinal test probe direction L. Dielectric filling element 2 in hollow conductor 1 reduces the propagation speed of the electromagnetic waves in hollow conductor 1, resulting in a lower frequency of the signal to be transmitted with the same diameter of the hollow conductor. Regardless of the polarization of coupled electromagnetic waves 21a,21b, these are converted by means of polarizer 6 within probe 10 into a circular electromagnetic wave, which in turn consists of two linearly polarized waves with a phase shift of 90°. In absorber 9, which is disposed downstream, one of these linearly polarized waves is then absorbed; the other wave propagates further and is converted in the subsequent transition in taper portion 13 to a power-bound, coaxial electromagnetic wave in contact portion 4.

A second preferred embodiment of the test probe according to the invention is described below with reference to FIGS. 6-7b. Identical elements are provided with the same reference signs. To avoid repetition, only differences to the first embodiment are discussed.

Lens element 3 has a stepped design in this embodiment. Lens element 3 preferably has a flat, preferably circular, front surface 11 and at least two, preferably at least three, coaxially disposed tiers 12a-12d which increase in diameter. A collar 18 (not shown) associated with lens element 3 can be provided analog to the first embodiment. Likewise, analog to the first embodiment, a conductor element 5 extending in the longitudinal direction can be provided in the lens (not shown).

Lens element 3 is preferably integral with filling element 2. Filling element 2 is designed in one piece and preferably extends over the entire length of hollow conductor 1. The filling element is configured such that it preferably fills hollow conductor 1 completely. In particular, there are preferably no recesses in filling element 2.

In this case, test probe 10 has a first portion 24 with a constant diameter which is disposed downstream of lens element 3 in longitudinal direction L. A constantly tapered taper portion 23 with a constant cross-sectional shape is disposed downstream of said first portion 24. Said taper portion 23 has a diameter of hollow conductor 1 and filling element 2 disposed therein, said diameter preferably being constantly tapered in the longitudinal direction.

For a high-frequency application at 28 GHz, this embodiment can have, for example, a filling element made of Preperm950 with a relative permittivity of 9.5. The test probe preferably has a diameter D of the hollow conductor in first portion 24 of 3 to 4 mm, particularly preferably 3.6 mm. A total length $L_G$ of the test probe is preferably 30 to 40 mm, particularly preferably 34 mm. A lens length $L_L$ is preferably 5 to 15 mm, particularly preferably 10 mm. A length of taper element 23 is preferably 8 to 18 mm, particularly preferably 14 mm.

Downstream of taper portion 23, contact portion 4 of test probe 10 is disposed with a constant cross-sectional shape. Said contact portion 4 comprises two contact elements 16a,16b offset relative to each other in the longitudinal direction which are designed for tapping or coupling out a respective wave with linear polarization, in particular a first horizontal polarization, and a second vertical polarization. In the present example, electrical contact elements 16a,16b are each designed as a circuit board and can each comprise an associated coaxial connector, which is disposed on the lateral surface of hollow conductor 1 or on an outer section of the circuit board. The contact elements preferably each comprise an electrical conductor 17a,17b, which is disposed in hollow conductor 1 perpendicular to longitudinal direction L and which is preferably formed as a conductor track. A preferably circular area 17c centrally surrounding the electrical conductor is made of dielectric material.

Contact portion 4 has a layered structure. In particular, a first portion 2a of the filling element extends up to first circuit board 16a and abuts against it. A second, preferably cylindrical, portion 2b of the filling element is disposed subsequently, which extends between first and second circuit board 16a,16b. A third, preferably also cylindrical portion 2c of the filling element extends between second circuit board 16b and an end face closing element 1a of hollow conductor 1. Respective filling element portions 2b, 2c are surrounded by a cylindrical segment as a hollow conductor.

The second embodiment of test probe 10 enables in particular a differentiation between a first horizontal and a second vertical polarization of a detected electromagnetic wave. In particular an amplitude property can thus be measured for both a first and a second polarization. For this purpose, respective conductors 17a,17b are offset by 90° to each other in a cross sectional view, as shown in FIG. 7b.

The contact portion can also have two pin- or wire-shaped conductors 17d, e extending perpendicular to the longitudinal direction L. These are preferably disposed or formed in filling element 2, 2b, 2c extending parallel to first conductor 17a of first contact element 16a. In particular, a first conductor 17d is arranged downstream of contact element 16a in the longitudinal direction and a second conductor 17e is arranged downstream of contact element 16b. Conductors 17d, e serve as short circuits for providing optimized selectivity or isolation between the two coaxial outputs on first and second contact elements 16a,16b.

Figures 8, 9, 10:
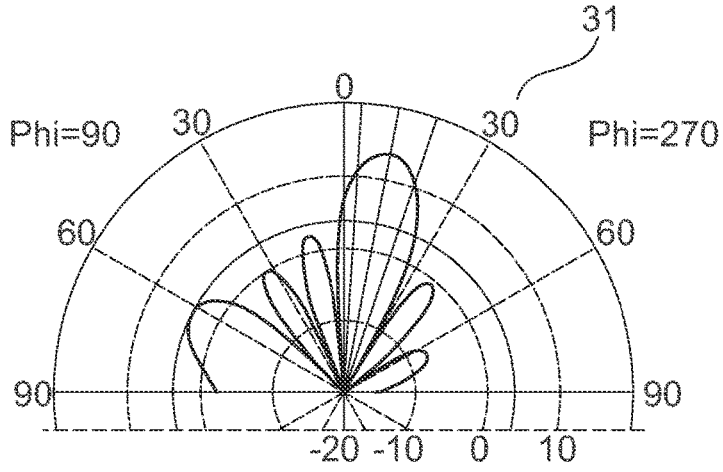
FIG. 8: shows a side view of the first embodiment according to FIG. 1 in interaction with a test object for measurement.
FIG. 9: shows a perspective view of a test device according to the invention for measuring an array antenna.
FIG. 10: shows an exemplary radiation pattern for evaluating the far-field attributes of an array antenna, calculated based on the near-field measurement of the test device according to the invention.

FIG. 9 shows a measurement of an array antenna 30, having a plurality of antenna elements 20, which are disposed in a predefined grid. The distance between individual antenna elements 20 is generally determined by the frequency range of array antenna 30. This usually corresponds to λ/2.

In this case, device 40 according to the invention for measuring an array antenna 30 has a plurality of test probes 10 as described above, wherein device 40 has at least one retaining element 41 (shown here merely schematically) for respective test probes 10. Retaining element 41 is configured to enable a preferred arrangement of respective test probes 10 relative to each other and/or to a respective array antenna 30 or to individual antenna elements 20 of array antenna 30.

It can advantageously be designed such that test probes 10 can be arranged relative to each other in a predefined manner, preferably at a distance d of λ/2 of the frequency emitted by array antenna 30. The device according to the invention also comprises an evaluation unit 42 connected to respective probes 10 and shown only schematically, which is designed to perform a near-field to far-field mapping algorithm for calculating or transforming the near-field measurement results to a far-field. For the sake of simplicity, only one signal line between a test probe 10 and evaluation unit 42 is shown.

When testing an array antenna 30, the signal transmission from the array antenna to each individual probe 10 serves as the measured variable. The measurement can be carried out using a known network analyzer, for example, and the data can be stored as S-parameters and processed further. Ideally, in each probe 10, both the horizontal and the vertical polarization are transmitted separately to a coaxial output and transmitted to evaluation unit 42 for signal evaluation.

Based on the measurement results of individual test probes 10 recorded in the near field, a calculation or transformation of the near-field measurement results to a far field can then be performed. An exemplary result for such an evaluation is shown in FIG. 10, which shows a one-dimensional radiation pattern 31 of array antenna 30.

A measurement of array antenna 30 can be carried out independently of an exact assignment of individual test probes 10 to antenna elements 20 of array antenna 30. In this way, for example, the characteristics of an array antenna 30 having 1×2 or 2×2 antenna elements 20 can be recorded, analyzed and/or subjected to a near-field to far-field transformation using a test device 40 or a probe array having 4×4 test probes 10.

Individual test probes 10 of test device 40 can also be assigned directly to antenna elements 20 of array antenna 30, enabling even more precise testing. The precise assignment means that individual antenna elements 20 can be tested directly and, in particular, defective antenna elements can also be detected immediately.

FIGS. 11-14 show a further preferred embodiment of a test device 40 having a multilayer circuit board 50 for connecting individual test probes 10. Multilayer circuit board 50 is disposed on contact portion 4 of respective test probes 10 analog to the embodiment shown in FIGS. 7a,7b and extends perpendicular to longitudinal direction L of the test probes. In this case, multilayer circuit board 50 is embedded in a layered manner in the hollow conductor in the longitudinal direction of test probe 10, analog to the arrangement of respective circuit boards 16a,16b in FIGS. 6 and 7a.

Multilayer circuit board 50 has an array or grid 51 of several contacting portions 52, by means of which individual test probes 10 can be contacted with multilayer circuit board 50. Contacting portions 52 are preferably designed to differentiate between a first horizontal and a second vertical polarization of a respectively detected electromagnetic wave in hollow conductor 1. For this purpose, the contacting portions each comprise one electrical conductor 53a,53b, which is disposed perpendicular to longitudinal direction L with respect to respective hollow conductor 1 of test probe 10, two electrical conductors 53a,53b being disposed so as to be offset by 90° with respect to each other in a cross sectional view. Electrical conductors 53a,53b are advantageously formed as circuit paths of circuit board 50. A preferably circular area 53c centrally surrounding electrical conductors 53a,53b is made of dielectric material. Said area 53c is preferably adapted to respective hollow conductor 1 of associated test probe 10 regarding its shape and arrangement.

Individual conductors 53a,b are electrically contacted via circuit paths 54 formed in multilayer circuit board 50. These can extend on a surface of the circuit board and/or inside the circuit board and be connected by means of vias. A respective conductor 53a,53b of a contacting portion 52 of the multilayer circuit board is advantageously connected to a respective coaxial connector 55, for example via a microstrip 56 extending on the surface of the circuit board for tapping the measuring signal. For the sake of simplicity, only one connector 55 is shown in FIGS. 11 and 12.

Figures 11, 12, 13, 14:
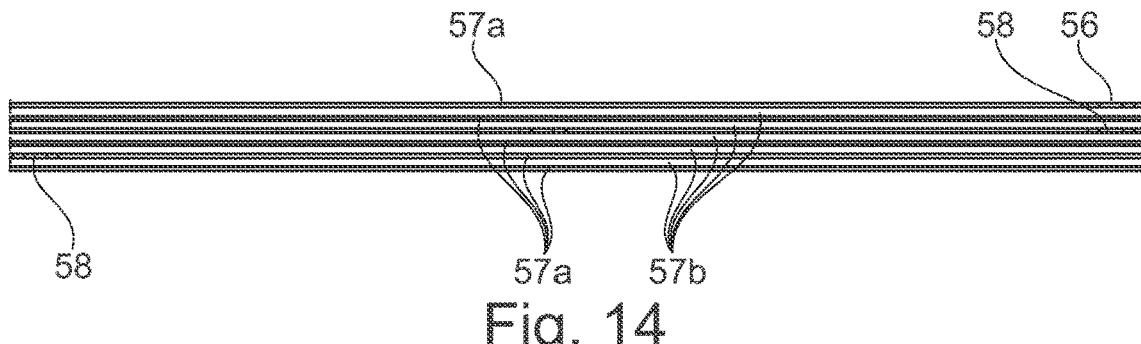
FIG. 11, 12: show a perspective view and top view of an exemplary embodiment of a multilayer circuit board for coupling to a plurality of test probes.
FIG. 13: shows a detailed view of the multilayer circuit board according to FIG. 12.
FIG. 14: shows a lateral sectional view of a multilayer circuit board.

FIG. 14 shows merely schematically a structure of the multilayer circuit board 50 having several ground planes 57a extending parallel to each other, which are separated from each other by dielectric layers 57b. In circuit board 50, the circuit paths are formed as strip lines 58 or as microstrips 56 extending on the surface of circuit board 50. A thickness of multilayer circuit board 50 and the respective position of electrical conductors 53a,53b is adapted to a desired position for signal tapping in the longitudinal direction of test probe 10.

The embodiments described above are merely exemplary, and the invention is by no means limited to the embodiments shown in the figures.

LIST OF REFERENCE SIGNS

1 hollow conductor
1a closing element
2 filling element
2a-c filling element portions
3 lens element
4 contact portion
5 electrical conductor
6 polarizer
7a,b groove-shaped recesses
8 lateral surface
8a,8b side portions lateral surface
9 absorber
10 test probe
10a tip test probe
10b opposite end test probe
11 plane front surface
12a-d tiers
13 taper portion
14 conductor element
15 coaxial connector
15a outer conductor
15b inner conductor
15c bent wire
16a,b outputs
17a,b Leiter
17c dielectric material
17d,e short circuit conductor
18 collar
19 extension recesses, groove bottom
20 antenna element
21a,b polarized waves
23 taper portion
24 first portion
30 array antenna
31 radiation pattern
40 test device
41 retaining element
42 evaluation unit
50 multilayer circuit board
51 grid
52 contacting portions
53a,b electrical conductors
53c dielectric material
54 circuit paths

55 coaxial connector multilayer circuit board
56 microstrip
57a ground planes
57b dielectric layer, polymer
58 strip line
E1, E2 first, second plane
L longitudinal direction
L$_G$ total length
L$_L$ lens length
L$_1$ polarizer length
L$_2$ absorber length
L$_3$ taper length
D distance

The invention claimed is:

1. A test probe (10) for contactlessly measuring the electromagnetic properties of a radio unit (20) comprising
   a hollow conductor (1) for transmitting electromagnetic waves,
   a filling element (2) which is disposed in the hollow conductor and made of dielectric material,
   a lens element (3) which is disposed on the end face of the hollow conductor (1) and made of a dielectric material for coupling electromagnetic waves into the hollow conductor (1), and
   a contact portion (4) which is disposed on the hollow conductor end opposite the lens element (3) for decoupling a measurement signal.

2. The test probe according to claim 1, wherein the hollow conductor (1) is a circular hollow conductor, and wherein the lens element (3) is formed so as to protrude from the hollow conductor (1) in the longitudinal direction (L) of the test probe (10).

3. The test probe according to claim 2, wherein the radio unit comprises an antenna unit, and wherein the circular hollow conductor is a circular, oval or elliptical cross section.

4. The test probe according to claim 1, wherein the filling element (2) of the hollow conductor is made of plastic or ceramic material and extends over the total length (L) of the hollow conductor.

5. The test probe according to claim 1, wherein the lens element (3) is formed integrally with the filling element (2) and forms an electric lens on a tip (10a) of the test probe (10).

6. The test probe according to claim 1, wherein the lens element (3) is an ellipsoid on a tip (10a) of the test probe (10).

7. The test probe according to claim 1, wherein the lens element (3) forms a tiered tip (10a) of the test probe, the tiered tip having a planar front surface (11) and at least two coaxially disposed tiers (12a, b) which increase in diameter.

8. The test probe according to claim 1, wherein the hollow conductor (1) has a collar (18) made of conducting material for shielding against laterally inciding electromagnetic waves, said collar being assigned to the lens element (3).

9. The test probe according to claim 1, wherein the lens element (3) has an electrical conductor (5) which extends at least partially in the longitudinal direction (L) of the test probe and which is disposed centrally.

10. The test probe according to claim 1, wherein the test probe (10) has a polarizer (6) disposed downstream of the lens element (3) in the longitudinal direction, said polarizer (6) being configured to convert the electromagnetic waves of linear polarization inciding the test probe into a circular electromagnetic wave.

11. The test probe according to claim 10, wherein the polarizer (6) has a plurality of parallel, groove-shaped recesses (7a, 7b), which are disposed in a lateral surface (8) of the filling element and which extend perpendicular to the longitudinal direction (L) of the test probe (10).

12. The test probe according to claim 9, wherein the test probe has an absorber (9) made of ferromagnetic material, disposed downstream of the polarizer (6) in the longitudinal direction (L), extending in a plane (E1) in the longitudinal direction and disposed at an offset of 45° with respect to an extension of the groove-shaped recesses (7a, 7b) of the polarizer (6) in a longitudinal sectional view.

13. The test probe according to claim 12, wherein the test probe has a taper portion (13) which is disposed downstream of the absorber (9) in the longitudinal direction (L) and in which the filling element (2) is tapered along a plane (E2) in the longitudinal direction (L), said plane (E2) being positioned orthogonally to the plane in which the absorber (9) extends.

14. The test probe according to claim 13, wherein the taper portion (13) has a conductor element (14) which is formed complementarily to the filling element (2) and which broadens in the longitudinal direction.

15. The test probe according to claim 1, wherein the contact portion (4) of the test probe (10) has a coaxial connector (15), in particular an SMPM connector, for inductive magnetic field coupling.

16. The test probe according to claim 1, wherein the contact portion (4) has two outputs (16a, 16b) for tapping the respective linear polarizations.

17. The test probe according to claim 16, wherein the contact portion has two conductors (17a, 17b) spaced apart from each other and disposed in the hollow conductor (1) perpendicular to the longitudinal direction (L).

18. A device (40) for testing an array antenna (30) having a plurality of test probes (10) according to claim 1, wherein the device has at least one retaining element (41) for each test probe (10), said retaining element (41) allowing a predefined arrangement of the test probes (10) relative to each other, at a distance (d) of $\lambda/2$ of the frequency emitted by the array antenna (30).

19. The device according to claim 18, wherein the device (40) comprises an evaluation unit (42), which is connected to the test probes (10) and configured to perform a near-field to far-field mapping algorithm for calculating or transforming the near-field measurement results to a far-field.

20. A method for contactless measurement of the electrical or electromagnetic properties of a radio unit (20, 30), in particular an antenna unit or an array antenna, wherein the radio unit emits microwave signals in the frequency band of the 5G mobile phone standard, and wherein the emitted microwave signals are detected by an assigned test probe (10) according to claim 1 or a test device (40) according to claim 18 and evaluated by an assigned evaluation unit (42).

* * * * *